(12) United States Patent
Kawano

(10) Patent No.: US 6,387,741 B1
(45) Date of Patent: May 14, 2002

(54) MANUFACTURING A SEMICONDUCTOR DEVICE WITH ISOLATED CIRCUIT-ELEMENT FORMATION LAYERS OF DIFFERENT THICKNESSES

(75) Inventor: Michihiro Kawano, Miyazaki (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 0 days.

(21) Appl. No.: 09/762,056
(22) PCT Filed: Jun. 3, 1999
(86) PCT No.: PCT/JP99/02981
  § 371 Date: Feb. 1, 2001
  § 102(e) Date: Feb. 1, 2001
(87) PCT Pub. No.: WO00/75981
  PCT Pub. Date: Dec. 14, 2000
(51) Int. Cl.[7] .................................................. H01L 21/84
(52) U.S. Cl. ........................ 438/165; 438/164; 438/404
(58) Field of Search ................................ 438/149, 164, 438/165, 404

(56) References Cited

U.S. PATENT DOCUMENTS

| 5,279,978 A | * | 1/1994 | See et al. | 437/34 |
| 5,463,238 A | * | 10/1995 | Takahashi et al. | 257/351 |
| 2001/0005030 A1 | * | 6/2001 | Imai | 257/348 |

FOREIGN PATENT DOCUMENTS

| JP | 54-61488 | 5/1979 |
| JP | 57-196543 | 12/1982 |
| JP | 63-177564 | 7/1988 |
| JP | 07-106579 | 4/1995 |

* cited by examiner

Primary Examiner—Charles Bowers
Assistant Examiner—Stephen W. Smoot
(74) Attorney, Agent, or Firm—Finnegan, Henderson, Farabow, Garrett & Dunner, L.L.P.

(57) ABSTRACT

Silicon layers 2a, 2b comprised of different thicknesses are formed concurrently so as to be isolated from each other while a silicon oxide layer 1 serving as a foundation layer is controlled to be free from hollows by implanting ions only into a field silicon oxide layer 5a comprised of a thick film thickness among field silicon oxide layers 5a, 5b to be used for separating circuit elements, and thereby altering etching rates of the field silicon oxide layers 5a, 5b.

12 Claims, 3 Drawing Sheets

MANUFACTURING A SEMICONDUCTOR DEVICE WITH ISOLATED CIRCUIT-ELEMENT FORMATION LAYERS OF DIFFERENT THICKNESSES

TECHNICAL FIELD

The present invention relates generally to a method for manufacturing a semiconductor device wherein isolated circuit-element formation layers with different thicknesses are located on an insulating layer, and especially relates to a method for manufacturing a semiconductor device wherein silicon layers having different thicknesses in an SOI (Silicon-On-Insulator) structure are isolated.

BACKGROUND ART

In circuit elements of an SOI structure, in the case of forming a bipolar transistor and a MOSFET, are formed on the same insulating substrate, and to form several MOSFETs having different thresholds thereon a technique is used whereby silicon regions having different thicknesses are formed, as is disclosed in Japanese Patent Application Laid-open No. 7-106579 (1995).

Isolation of the elements is accomplished by selectively oxidizing circuit-element formation layers to form field oxide films. However, in the case of an SOI substrate, at edge parts where the field oxide film and the circuit-element formation region are in contact with each other, impurities of the circuit element formation part, for example, BF2+ ions, diffuse into the field oxide film, whereby the impurity concentration of the edge part becomes lower than that of other regions removed from the edge parts. As a result, leak current occurs at the edge parts where the field oxide film and the circuit-element formation region are in contact with each other.

Therefore, it is necessary to remove the field oxide films and inject impurities for preventing leakage into the edge parts.

A method for manufacturing a semiconductor device in which silicon layers having different thicknesses are isolated will be described referring to FIG. 3A to FIG. 3C.

In this conventional example, in order to isolate the circuit elements, the field oxide films are temporarily formed and then these field oxide films are removed.

In the process of FIG. 3A, first, silicon film layers 2 having different thicknesses are formed on a silicon oxide layer 1, and a silicon oxide ($SiO_2$) layer 3 is deposited thereon.

Furthermore, a silicon nitride ($Si_3 N_4$) layer 4 is deposited, by means of the LP (Low Pressure) CVD method, on the silicon oxide layer 3. Following this, the silicon nitride layer 4 is masked with a resist and patterned to a predetermined form.

Next, in the process of FIG. 3B, the silicon nitride layers 4 are used as a mask and selective wet-oxidization is performed. By this wet-oxidization, field silicon oxide layers 5a, 5b having different thicknesses are formed.

Next, in the process of FIG. 3C, by using an etching liquid (etchant) in which hydrofluoric acid (HF) and water are mixed to a ratio of 1 to 19, wet etching on the field silicon oxide layers 5a, 5b is performed, so that boundary portions between the silicon oxide layer 1 and the silicon film layer 2 are exposed. As a result, isolated circuit elements, namely, silicon film layers 2a, 2b, are formed having different film thicknesses.

However, in the case of etching the field silicon oxide layers 5a, 5b, the silicon oxide layer 1 that was made of the same material as the field silicon oxide layers 5a, 5b may also be etched.

That is, when the silicon film layers 2a, 2b, each of which was part of silicon film layer 2 and comprised of different thickness, are isolated, the thickness of each of the field silicon oxide layers 5a, 5b becomes proportional to the thickness of the silicon film layer 2 for oxidation.

Consequently, in the wet etching process as shown in FIG. 3C, if the wet etching with an adjusted etching time for the field silicon oxide layer 5a comprised of a thick film thickness is performed, even the silicon oxide layer 1 that exists bellow the field silicon oxide layer 5b comprised of a thin film thickness is etched, forming hollows. Those hollows are underetchings that reach down to an underside of the silicon film layer 2b, and then an element formed on the silicon film layer 2b becomes insufficient structure.

DISCLOSURE OF THE INVENTION

An object of the present invention is to provide a method for manufacturing a semiconductor device that has no hollows of a under layer comprising the approximate same material as the field oxide film, thus increasing the yield of the semiconductor device and improving reliability.

There is provided a method of manufacturing a semiconductor device for isolating circuit-element formation layers comprised of different thicknesses on an insulating layer, comprising the processes of: forming a plurality of circuit-element formation layers each of which is partitioned by steps and comprised of a different film thickness on the insulating layer; forming an antioxidation film on each region according to the circuit-element formation layer comprised of the different film thickness; oxidizing the circuit-element formation layers by using the antioxidation film as a mask to form field oxide films comprised of different thicknesses between the circuit-element formation layers; implanting ions only into the field oxide films comprised of a thick film thickness among the field oxide films comprised of different thicknesses; and etching concurrently the field oxide films comprised of different thicknesses.

Here, a substrate after the ion implantation may be annealed at a temperature not less than 900° C.

The insulating layer may be silicon oxide, the circuit-element formation layer may be a silicon layer, and the field oxide film may be silicon oxide film.

The insulating layer may be formed on a silicon substrate.

The antioxidation film may be silicon nitride.

The ion species for the implanting process may be one of boron fluoride (BF+2), argon (Ar+), arsenic (As+), and phosphorus (P+).

The process of etching the field oxide film may be wet etching with the use of an etching liquid of a mixture of hydrofluoric acid (HF) and water.

The process of forming the plurality of circuit-element formation layers, each of which is partitioned by the steps and comprised of the different film thickness on the insulating layer, may comprise the processes of: preparing a substrate such that an insulating layer may be formed thereon and a silicon layer whose thickness may be approximately uniform may be formed on the insulating layer, and forming the antioxidation film on the silicon layer according to a region where its film thickness is thick; selectively oxidizing the silicon layer according to a region where its film thickness may be thin by using the antioxidation film as a mask and oxidizing the surface of the thin film thickness region so that a thin silicon layer may remain existing; etching an oxide film formed by the oxidizing process; and removing the antioxidation film.

The antioxidation film may be silicon nitride.

The thin oxide film may be formed between the silicon layer and the antioxidation film.

The process may include implanting an ion into an edge part of the circuit-element formation layer that are newly exposed by etching after the process of etching the field oxide films comprised of different thicknesses.

The process may include implanting an ion for adjusting a threshold value of an MOS transistor.

BEST MODE FOR CARRYING OUT THE INVENTION

Preferred embodiment of the present invention will be described in detail with reference to the drawings.

In this example, a method for manufacturing a semiconductor device will be described. This method is featured in that regions of a silicon layer comprised of different thicknesses in an SOI structure are isolated.

In this method, forming silicon layers comprised of different thicknesses to each other will be described. The following method shows a case where thicknesses of the silicon layers of 145 nm and 10 nm, respectively, are formed.

First, an SOI substrate, such as a silicon oxide layer 1 was formed on a silicon single crystal substrate and a silicon single crystal layer 2 was formed thereon. The SOI substrate used was a product of Canon Inc. under the trademark name called ELTRAN.

Using this SOI substrate, silicon layers comprised of different thicknesses are formed.

Figure 1A:
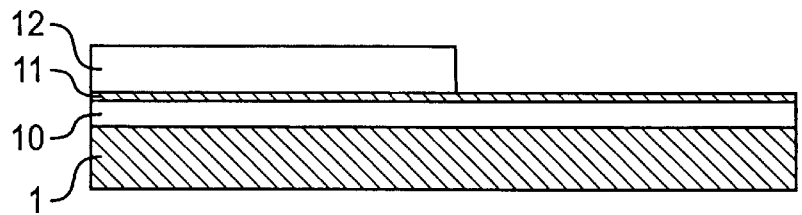
FIG. 1A to FIG. 1E show a method for manufacturing a semiconductor device as one embodiment according to the present invention.

The process of FIG. 1A is described. A silicon oxide ($SiO_2$) film 11 of a thickness of 20 nm is formed on a silicon film layer 10 of a thickness of 155 nm using conditions, for example, of an oxidation temperature of 950° C., a hydrogen gas flow of 5 liters/minute, an oxygen gas flow of 10 liters/minutes, and an oxidation time of 6 minutes.

Next, a silicon nitride ($Si_3 N_4$) layer 12 of a thickness of 140 nm is deposited on the silicon oxide layer 11. Deposition of this layer is performed by means of the LP (Low Pressure) CVD method using conditions, for example, of a deposition temperature of 760° C., an $SiH_2Cl_2$ gas flow of 20 sccm, an $NH_3$ gas flow of 220 sccm, and a deposition time of 140 minutes.

Next, the silicon nitride layer 12 is formed to a predetermined pattern by using a resist as a mask. That is, the silicon nitride layer 12 is formed so as to remain in an area according to a thick part of the silicon film layer 10.

Figure 1B:
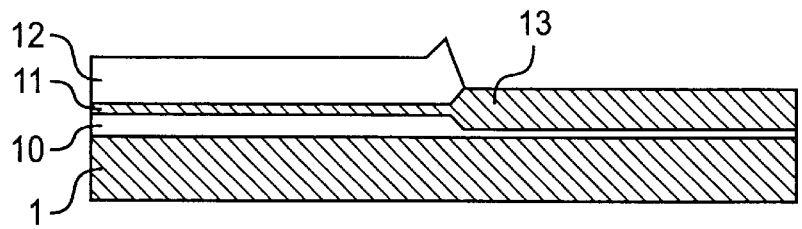

Next, the process of FIG. 1B is described. Selectively wet oxidation is performed by using the silicon nitride layer 12 as a mask. This wet etching process is performed using conditions, for example, of an oxidation temperature of 1000° C., a hydrogen gas flow of 8 liters/minute, an oxygen gas flow of 4.5 liters/minute, and an oxidation time of 35 minutes.

By the way, the wet oxidation referred to is intended to signify an oxidation process using an excessive amount of hydrogen gas, in contrast to dry oxidation that uses an oxidation process having a scanty amount of hydrogen gas.

By performing wet oxidation like this, the silicon film layer 10 in a region that is not masked is oxidized to form a silicon oxide layer 13 having a thickness of 90 nm.

Figure 1C:
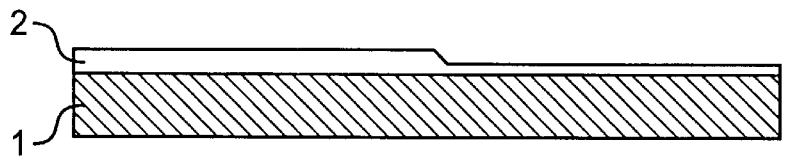

Next, the process of FIG. 1C is described. Etching is performed by using an etching liquid of a mixture of hydrofluoric acid (HF) and water in a ratio of 1 to 19 for an etching time of 11.8 minutes. The silicon oxide layer 13 is removed by this etching.

Next, the silicon nitride layer 12 and the silicon oxide layer 11 are removed. In this case, the removal of the silicon nitride layer 12 and the silicon oxide layer 11 is performed, for example, using an etchant of an aqueous solution of 90 percent $H_3PO_4$ under conditions of: a temperature of 160° C., and a removal time of 90 minutes. By using a series of the process as described above, the silicon film layers 2 are formed as regions comprised of different thicknesses to each other.

Figure 1D:
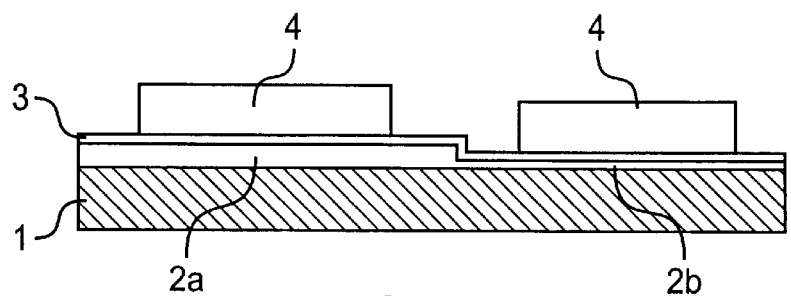

Next, the process of FIG. 1D is described. On each region comprised of different thickness on the silicon film layer 2, a silicon oxide ($SiO_2$) layer 3 is formed of a thickness of 20 nm under conditions, for example, as follows: an oxidation temperature of 950° C., a hydrogen gas flow of 5 liters/minute, an oxygen gas flow of 10 liters/minute, and an oxidation time of 6 minutes.

Next, a silicon nitride ($Si_3 N_4$) layer 4 of a thickness of 140 nm is deposited on the silicon oxide layer 3. The deposition of this layer is performed by means of the LP (Low Pressure) CVD(Chemical Vapor Deposition) method 4 under conditions, for example, as follows: a deposition temperature of 760° C., an $SiH_2Cl_2$ gas flow of 20 sccm, and an $NH_3$ gas flow of 220 sccm, and a deposition time of 140 minutes.

Next, the silicon nitride layer 4 is formed to a prescribed pattern using a resist as a mask. Etching treatment in this process is performed by means of plasma etching under conditions, for example, as follows: a $CF_4$ gas flow of 36.5 sccm, RF output power of 150 W, and a treatment time of 180 sec.

As a result, patterned silicon nitride layers 4 are formed on the respective silicon film layers 2a, 2b of different thicknesses.

Figure 1E:
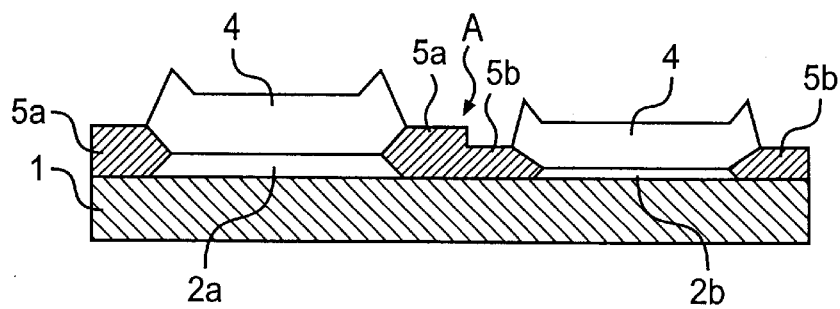

Next, the process of FIG. 1E is described. Selectively wet oxidation is performed by using the silicon nitride layers 4 as a mask. This wet oxidation is performed under conditions, for example, as follows: an oxidization temperature of 1000° C., a hydrogen gas flow of 8 liters/minute, an oxygen gas flow of 4.5 liters/minute, and an oxidization time of 112 minutes.

Using a the wet oxidization, a part of the silicon film layer 2 in the region where it is not covered with the mask is oxidized, and the field silicon oxide layers 5a, 5b comprised of different thicknesses of 290 nm and 200 nm, respectively, are formed on both sides of a step A.

Due to the formation of these field silicon oxide layers 5a, 5b, the silicon film layer 2 is isolated into the silicon film layer 2a comprised of a thick film thickness and the silicon film layer 2b comprised of a thin film thickness. In this case, since oxygen can go in by a roundabout way into the edge parts of the silicon film layers 2a, 2b and silicon nitride layers 4, the edge parts form themselves into the shape called "bird beak".

The following description is for explaining a process of removing the field silicon oxide layers 5a, 5b.

Figure 2A:
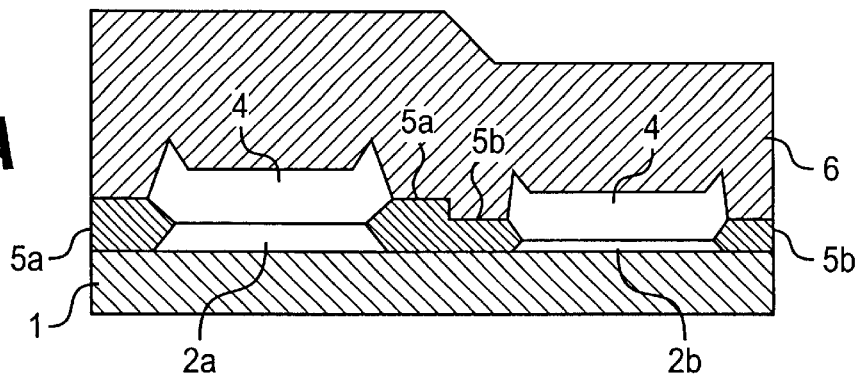
FIG. 2A to FIG. 2F show additional steps in a continuation of the method for manufacturing a semiconductor device shown in FIGS. 1A to 1E.

Next, the process of FIG. 2A is described. Resist 6 of a thickness of 1300 nm is coated over the whole surface of the substrate including the field silicon oxide layers 5a, 5b. Further, the substrate is exposed with one side region being masked, and only the resist 6 on the side of the field silicon oxide layer 5a is removed.

Figure 2B:
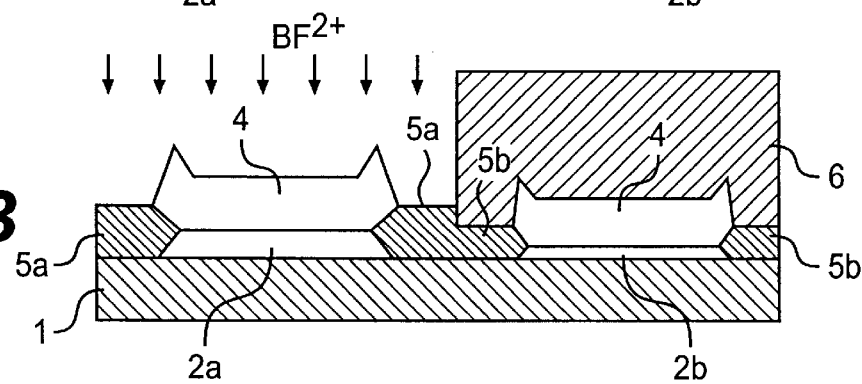

Next, the process of FIG. 2B is described. BF+2 ions are implanted only into the field silicon oxide layer 5a comprised of a thick film thickness by using the resist 6 on the side of the field silicon oxide layer 5b as a mask.

In this case, the ion implantation is performed by using an ion implanter under conditions, for example, as follows: an acceleration energy of 65 keV, and a dose of $7.5 \times 10^{14}$ /cm$^2$. For alternative ion species, argon (Ar+), arsenic (As+), phosphorus (P+), and the like, may be used.

Next, after the resist 6 is removed, an annealing process is performed. This annealing is performed under conditions, for example, as follows: a temperature of 950° C., a nitrogen gas flow of 15 liters/minute, and an annealing time of 20 minutes.

Figure 2C:
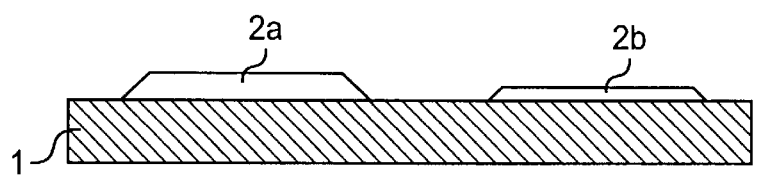

Next, the process of FIG. 2C is described. The field silicon oxide layers 5a, 5b are etched. This etching is performed under conditions, for example, as follows: use an etching liquid of a mixture of hydrofluoric acid (HF) and water in a ratio of 1 to 19, and an etching time of 11.8 minutes. By this process, the field oxide film layers 5a, 5b are etched to expose the boundaries of the silicon film layers 2a, 2b and part of silicon oxide layer 1. By the way, there may be a case where the etching can be performed without the annealing treatment.

Next, the silicon nitride layers 4 on the silicon film layers 2a, 2b are removed. In this case, the removal of the silicon nitride layers 4 is performed, for example, using an aqueous solution of 90 percent H$_3$PO$_4$ and conditions of a temperature of 160° C. and a removal time of 90 minutes. By using a series of the processes as have been described, the field silicon oxide layers 5a, 5b comprised of different thicknesses to each other are removed simultaneously.

Next, the process of element formation will be explained.

Figure 2D:
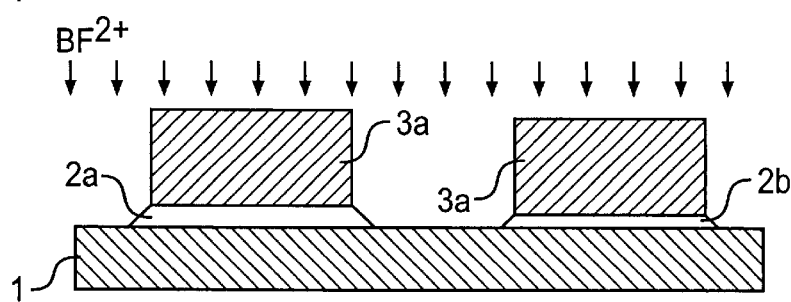

The process of FIG. 2D is described. A film of resist 3a is patterned so that the rest of the silicon film layers 2a, 2b are covered with the resist 3a on condition that only the edge parts of the silicon film layers 2a and 2b are exposed.

In this case, the edge part of the silicon layer is defined as an region where the thickness of the silicon film layer is thinner than that of the central part. Besides, the film thickness of the resist 3 is 1300 nm.

Next, ion implantation is performed in order to increase the impurity concentration of the edge parts of the silicon film layers 2a, 2b. The ion species to be implanted preferably is BF2+. In this case, the ions are implanted with an ion implanter under conditions, for example, as follows: an acceleration energy of 65 keV, and a dose of $7.5 \times 10^{14}$ /cm$^2$.

In this occasion, it is essential to remove the field silicon oxide films in order to implant ions uniformly into the edge parts of the silicon layers.

Figure 2E:
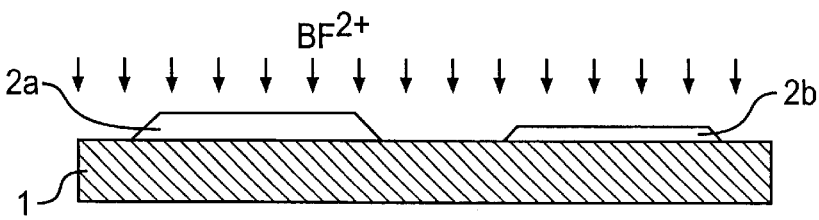

Next, the process of FIG. 2E is described. After the resist 3a was removed, ion are implanted into the silicon film layers 2a and 2b for adjusting the threshold. The ion species to be implanted preferably is BF2+. In this case, the ions are implanted with an ion implanter under conditions, for example, as follows: an acceleration energy of 35 keV, and a dose of $3.0 \times 10^{12}$ /cm$^2$.

Figure 2F:
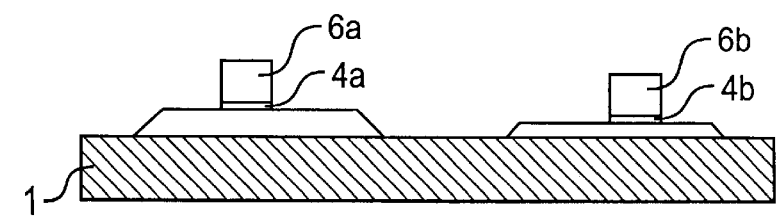

Next, as shown in FIG. 2F, gate oxide films 4a and 4b and polysilicon gates 6a and 6b are formed to produce an MOS transistor.

Next, the correlation between with the ion implantation and the etching rate of the field silicon oxide layers 5a, 5b is described.

Table 1 shows an etching rate comparison of the case in that BF2+ ions are implanted into the field silicon oxide layers 5a, 5b and the case with no ion implantation. Besides, the etching process is performed on condition of the etching liquid of a mixture of hydrofluoric acid (HF) and water in a ratio of 1 to 19.

TABLE 1

Correlation of ion implantation and silicon oxide film

| Ion implantation conditions | Etching rate of etchant comprising HF and water (mixing ratio = 1 to 19) |
|---|---|
| Ion implantation (BF2+: 7.5 × 10$^{14}$ /cm$^2$, 65 keV) Annealing processing | 250 Angstroms/minute |
| no ion implantation | 170 Angstroms/minute |

It was found, as shown in this Table 1, that the etching rate is 170 Angstroms/minute with no ion implantation, whereas, the etching rate becomes 250 Angstroms/minute with ion implantation. That is, the ion implantation is found to accelerate the progress speed of the etching. In the case of the annealing process, it is preferable that the annealing temperature is not less than 900° C. If the annealing temperature is below 900° C., sufficient effect of the annealing is not expected.

By the way, in this example, if the annealing process is not conducted, the etching rates becomes larger by a factor of four or so.

With the intention of using the fact that the etching rate can be altered by choosing whether or not the ion implantation is applied, as described above, the present process chooses a setting such that the ion implantation process is performed to the field silicon oxide layer 5a comprised of a thick film thickness, whereas no ion implantation process is performed to the field silicon oxide layer 5b comprised of a thin film thickness.

By this method, in the above-mentioned process of FIG. 2C, in the field silicon oxide layer 5b comprised of a thin film thickness, the rate of progress of the etching is slow, whereas in the field silicon oxide layer 5a comprised of a thick film thickness into which the ions are implanted, the rate of progress of etching can be modified to be fast. Therefore, both of the field silicon oxide layers 5a, 5b can be equally removed concurrently at the point of time when the etching reaches the surface of the silicon oxide film 1.

Figure 3A:
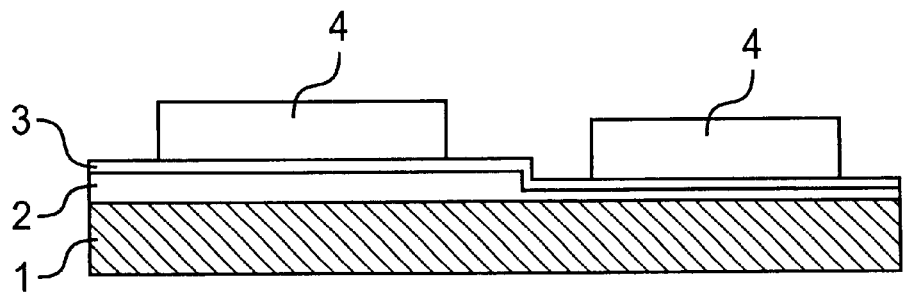
FIG. 3A to FIG. 3C show a conventional method for manufacturing a semiconductor device.
Figure 3B:
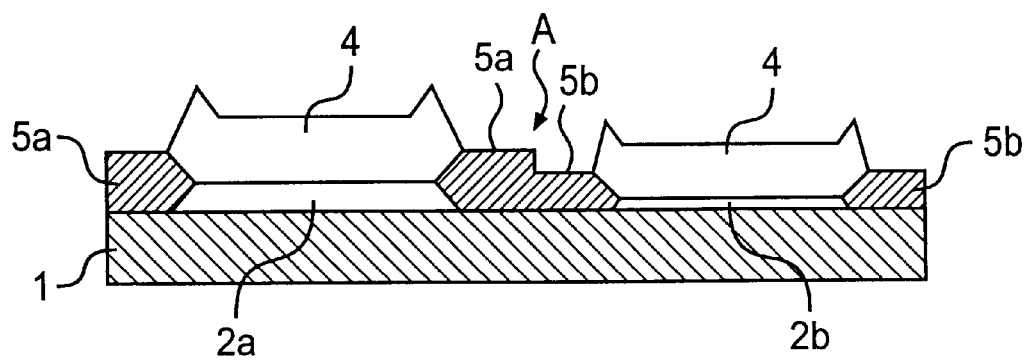
Figure 3C:
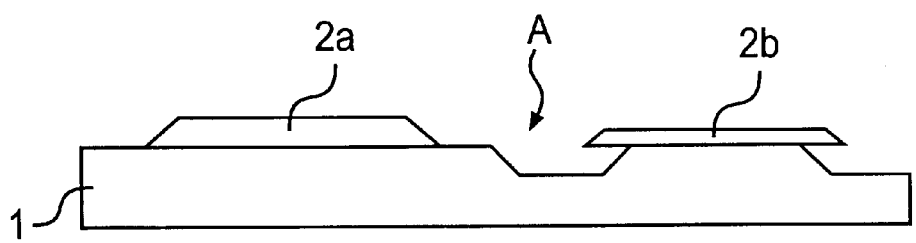

Consequently, the present invention can eliminate the phenomenon as shown in the conventional example of FIG. 3C, wherein the silicon oxide layer 1 below the silicon film layer 2b comprised of a thin film thickness is etched.

As described above, according to the present invention, since the ions are implanted only into field oxide films comprised of a thick film thickness and the etching rates of the field oxide films comprised of different thicknesses are altered, even in the case where the field oxide films and their underlying foundation layer are constructed with the same material, the phenomenon of having the foundation layer etched can be eliminated, thereby improving the yield of semiconductor devices and manufacturing semiconductor devices with high reliability.

What is claimed is:

1. A method of manufacturing a semiconductor device having isolating circuit-element formation layers comprised of different thicknesses on an insulating layer, comprising the processes of:

forming a plurality of circuit-element formation layers each of which is partitioned by steps and comprised of a different film thickness on said insulating layer;

forming an antioxidation film on each region according to said circuit-element formation layer comprised of said different film thickness;

oxidizing said circuit-element formation layers by using said antioxidation film as a mask to form field oxide films comprised of different thicknesses between said circuit-element formation layers;

implanting ions only into said field oxide films comprised of a thick film thickness among said field oxide films comprised of different thicknesses; and etching concurrently said field oxide films comprised of different thicknesses.

2. A method of manufacturing a semiconductor device according to claim 1, wherein said substrate, after said ion implantation, is annealed at a temperature not less than 900° C.

3. A method of manufacturing a semiconductor device according to claim 1, wherein said insulating layer is silicon oxide, said circuit-element formation layer is a silicon layer, and said field oxide film is silicon oxide film.

4. A method of manufacturing a semiconductor device according to claim 3, wherein said insulating layer is formed on a silicon substrate.

5. A method of manufacturing a semiconductor device according to claim 1, wherein said antioxidation film is silicon nitride.

6. A method of manufacturing a semiconductor device according to claim 1, wherein said ion species for said implanting process is one of boron fluoride (BF+2), argon (Ar+), arsenic (As+), and phosphorus (P+).

7. A method of manufacturing a semiconductor device according to claim 1, wherein the process of etching said field oxide film is wet etching with the use of an etching liquid of a mixture of hydrofluoric acid (HF) and water.

8. A method of manufacturing a semiconductor device according to claim 1, wherein said process of forming the plurality of circuit-element formation layers each of which is partitioned by the steps and comprised of said different film thickness on said insulating layer comprises the processes of:

preparing a substrate such that an insulating layer is formed thereon and a silicon layer whose thickness is approximately uniform is formed on said insulating layer, and forming said antioxidation film on said silicon layer according to a region where its film thickness is thick;

selectively oxidizing said silicon layer according to a region where its film thickness is thin by using said antioxidation film as a mask and oxidizing the surface of said thin film thickness region so that a thin silicon layer remains existing;

etching an oxide film formed by said oxidizing process; and removing said antioxidation film.

9. A method of manufacturing a semiconductor device according to claim 8, wherein said antioxidation film is silicon nitride.

10. A method of manufacturing a semiconductor device according to claim 9, further comprising the process of forming a thin oxide film between said silicon layer and said antioxidation film.

11. A method of manufacturing a semiconductor device according to either of claim 1 or claim 8, further comprising:

the process of implanting an ion into an edge part of the circuit-element formation layer that are newly exposed by said etching after the process of etching said field oxide films comprised of different thicknesses.

12. A method of manufacturing a semiconductor device according to claim 11, comprising the process of implanting an ion for adjusting a threshold value of an MOS transistor.

* * * * *